(12) United States Patent
Niemann et al.

(10) Patent No.: US 7,215,230 B2
(45) Date of Patent: May 8, 2007

(54) METHOD FOR CALCULATING THE CONDUCTOR PATH OF A SUPERCONDUCTOR FROM THE COIL BODY TO THE JOINT AND ASSOCIATED DEVICES

(75) Inventors: Volker Niemann, Straubenhardt (DE); Klaus Schlenga, Linkenheim-Hochst. (DE)

(73) Assignee: Bruker Biospin GmbH, Rheinstetten (DE)

( * ) Notice: Subject to any disclaimer, the term of this patent is extended or adjusted under 35 U.S.C. 154(b) by 603 days.

(21) Appl. No.: 10/730,128

(22) Filed: Dec. 9, 2003

(65) Prior Publication Data

US 2004/0122638 A1 Jun. 24, 2004

(30) Foreign Application Priority Data

Dec. 23, 2002 (DE) .................................. 102 60 728

(51) Int. Cl.
*H01F 7/00* (2006.01)
*H01F 1/00* (2006.01)
(52) U.S. Cl. .................... 335/216; 335/296; 335/299
(58) Field of Classification Search ................ 335/216, 335/296–299
See application file for complete search history.

(56) References Cited

U.S. PATENT DOCUMENTS

| 3,559,128 A | 1/1971 | Kingston |
| 4,270,112 A | 5/1981 | Schneider-Muntau |
| 5,387,891 A | 2/1995 | Nick |

FOREIGN PATENT DOCUMENTS

| EP | 0331 998 | 9/1989 |
| JP | 54162097 | 12/1979 |
| JP | 61015305 | 1/1986 |

OTHER PUBLICATIONS

Plasma Science & Technology, vol. 2, No. 4 (2000), You-hau Zhu, "Analysis of the Superconducting Cable Transposition . . . " pp. 397-404.

(Continued)

*Primary Examiner*—Elvin Enad
*Assistant Examiner*—Bernard Rojas
(74) *Attorney, Agent, or Firm*—Paul Vincent

(57) ABSTRACT

A method for calculating the shape of a band-shaped superconductor (3) of a solenoid-shaped coil section of a high-field magnet coil (1) in a transfer region (5) is characterized in that the band-shaped superconductor (3) is changed in the transfer region from a first orientation (3a) tangentially flatly abutting on the surface of a cylindrical coil body (2) and substantially perpendicular to the longitudinal direction of the cylindrical coil body (2) to a second orientation (3b) with its narrow side seating on the surface of the cylindrical coil body and parallel to the longitudinal direction (or vice versa). The path z(u) is determined from the integral-differential equation $$\frac{z''(u)}{(1+z'(u)^2)^{\frac{3}{2}}} = \frac{\sin\left(\tau \int_0^u d\hat{u}\sqrt{1+z'(\hat{u})^2}\right)}{r_{min}}$$

wherein z: axial coordinate; u: azimuthal coordinate; $\hat{u}$: auxiliary coordinate; $\tau$: constant torsion in the transfer region; $r_{min}$ minimum bending radius of the band-shaped superconductor, and wherein the position z=0, u=0 is associated with a boundary point 4a, 4b of the transfer region. This permits conductor guidance of a brittle band-shaped superconductor of a solenoidal coil section in an axial direction in a compact construction without joints.

23 Claims, 2 Drawing Sheets

OTHER PUBLICATIONS

IEEE Transactions on Applied Superconductivity, vol. 10, No. 1, Mar. 2000, U. Hoeck et al., "Results of 3-Dimensional . . . Modelling of the Coil End-Regions . . . ", pp. 89-92.

S. Russenschuck, "Roxie—The routine for the optimization of magnet . . . ", (CERN, Geneva) 1999, pp. 1-6.

Haessner, Rainer, "Supraleitende Magnete für die NMR-Spektroskopie". TU Munich, Dec. 21, 2001, www.org.chemie.tu-muenchen.de/people/rh/nmrueb/magnet2/pdf.

METHOD FOR CALCULATING THE CONDUCTOR PATH OF A SUPERCONDUCTOR FROM THE COIL BODY TO THE JOINT AND ASSOCIATED DEVICES

This application claims Paris Convention priority of DE 102 60 728.1 filed Dec. 23, 2002 the complete disclosure of which is hereby incorporated by reference.

BACKGROUND OF THE INVENTION

The invention concerns a method for calculating the travel of a band-shaped superconductor in a coil section of a high field magnet coil through a transition region towards or away from the coil section, wherein the coil section is wound onto a cylindrical coil body in the shape of a solenoid.

A high field magnet coil with conventional conductor guidance is disclosed e.g. in "Supraleitende Magnete für die NMR-Spektroskopie" (superconducting magnet for NMR spectroscopy) by Rainer Haeβner, TU Munich, 21.12.2001, URL:http://www.org.chemie.tu-muenchen.de/people/rh/nmrueb/magnet2.pdf (see FIGS. 2 and 5).

Superconducting magnet coils are used for producing maximum magnetic field strengths, in particular for NMR (nuclear magnetic resonance) applications. Superconductors can carry electric current without loss within certain temperature ranges, magnetic field strength ranges and current strength ranges to thereby produce highly constant magnetic fields. High-temperature superconductors (HTSC), i.e. superconductors with a transition temperature above the boiling point of liquid nitrogen, are particularly suitable for magnet construction and can generate particularly high magnetic field strengths.

A conventional HTSC for magnet construction has a band shape, in particular with rectangular cross-section. It is relatively easy to produce and process.

A major problem in magnet construction is the transition points points) from one superconducting conductor section to another. These joints cannot usually be exposed to the same high magnetic field strengths as the other conductor sections. For this reason, one tries to locate the joints far away from the center of the magnet coil in a region of low magnetic field strength.

This may be difficult to realize when it is geometrically not possible (or undesirable for other reasons) to guide the band-shaped superconductor tangentially away from the coil winding (i.e. tangential to the surface of the cylindrical coil body and approximately perpendicular to the cylinder axis) due for example to the presence of radially outer coil sections which axially project beyond the coil winding in solenoidal coils.

When ductile flexible superconducting wires are used, the conductor can be bent relatively sharply at the end of a winding section of a solenoidal coil winding and extend through arbitrary distances away from the coil winding in the axial direction. A joint can therefore be disposed at a location having practically no magnetic field.

High-temperature superconductors (and other inflexible superconducting materials) do not permit such sharp bends. For solenoidal HTSC coil windings, the joints must be disposed at the upper or lower edge of the coil winding where there are still considerable magnetic fields which are, however, at least lower than in the central region of the coil winding. The superconducting conductor section connected to the solenoidal coil winding at such a joint is then guided out of the region of high magnetic field strength parallel to the cylinder axis of the coil body, (see Haeβner, loc. cit.). These joints at the edge of the coil winding limit the efficiency of the overall magnet coil for many applications.

U.S. Pat. No. 3,559,128 describes a magnet coil having a band-shaped superconductor wound about a cylindrical winding body. The band-shaped superconductor is thereby transferred from a state wherein it seats flatly on the winding body and extends in a peripheral direction to a state in which it is parallel to the longitudinal axis of the winding body and separated from an outer side of that body. The band-shaped superconductor is thereby bent.

U.S. Pat. No. 5,387,891 discloses a magnet coil having a band-shaped conductor containing superconducting filaments. One end of the band-shaped conductor is twisted about a longitudinal axis thereof.

U.S. Pat. No. 4,270,112 discloses a normally conducting or superconducting magnet coil having a conductor with nearly square cross section. The conductor is embedded in a tube-shaped holding cylinder. One end of the conductor is bent, without twisting, through an angle of 90° relative to the peripheral extension of the windings so that the end of the conductor travels parallel to the axis of the cylinder. The holding cylinder is hollow and suitable for holding a coolant.

It is the underlying purpose of the present invention to propose a travel path for inflexible, band-shaped superconductor material, in particular, HTSC material, which permits conductor guidance to or from such a solenoidal coil section in an axial direction under compact construction, without joints to thereby increase the efficiency of a high-field magnet coil.

SUMMARY OF THE INVENTION

This object is achieved in accordance with the invention with a method of the above-described type, wherein the band-shaped superconductor is transferred in the transition region from a first orientation tangentially flatly abutting the surface of the cylindrical coil body and substantially perpendicular to the longitudinal direction of the cylindrical coil body along a path to a second orientation with its narrow side abutting the surface of the cylindrical coil body and extending parallel to the longitudinal direction (or vice versa) with the path z(u) being determined from the integral-differential equation $$\frac{z''(u)}{(1+z'(u)^2)^{\frac{3}{2}}} = \frac{\sin\left(\tau \int_0^u d\hat{u}\sqrt{1+z'(\hat{u})^2}\right)}{r_{min}}$$

wherein z is the coordinate of the band-shaped superconductor in the longitudinal direction of the coil body and u the azimuthal coordinate of the band-shaped superconductor, wherein $\hat{u}$ is an auxiliary coordinate, $\tau$ a torsion which is constant over the length of the band-shaped superconductor in the transition region, and $r_{min}$ is the minimum allowable bending radius of the band-shaped superconductor with respect to its broad side, wherein the position (z=0, u=0) is associated with a boundary point of the transition region.

The apostrophes' each indicate the derivative, e.g. z'(u) =dz/du.

In accordance with the inventive method, the band-shaped superconductor of rectangular cross-section is bent about its broad side to a maximum bending radius $r_{min}$ and can be twisted in the longitudinal direction through τ (with the dimensions of angle per unit length) but not be bent about its narrow side. The resulting path z(u) can be represented as a diagram, wherein the curve starts typically at z=u=0 and has an asymptote at a defined u-value. At this u-value, the band-shaped superconductor has reached its axial orientation and does not require further bending. The axial direction is thereby obtained with the band-shaped superconductor abutting on the cylindrical coil body, i.e. without considerably increasing the space requirements beyond the radius of the cylindrical coil body. There is no interference with possible coil sections located further outwardly or other geometrical obstacles. Taking into consideration the minimum bending radius eliminates the risk of damage to the superconductor. The predetermined torsion defines the most compact possible shape for the band-shaped superconductor. This is particularly important when several axial conductor sections are provided at the end of a coil winding, i.e. for current supply and discharge. Towards this end, the conductor sections must not cross, i.e. the transition from azimuthal behavior to axial behavior must be obtained through a short space, preferably within half a perimeter.

One inventive method variant is particularly preferred with which the angle (φ between the flat side of the band-shaped superconductor and the local surface of the cylindrical coil body is determined according to $$\varphi(u) = \tau \int_0^u d\hat{u} \sqrt{1 + z'(\hat{u})^2}.$$

Knowledge of this functional relationship allows maintenance of constant torsion in the transition region in a particularly simple manner by determining the inclination with respect to the base (i.e. the cylindrical coil body or a groove which may be provided there).

One method variant is also particularly preferred with which τ is the maximum permitted torsion $\tau_{max}$ of the band-shaped superconductor. In this case, the band conductor can be transferred as quickly as possible from a tangential position to a position seating perpendicularly on the cylindrical coil body. In the perpendicular standing position, the bending properties of the band-shaped superconductor facilitate its axial extension. The space within which the axial conductor behavior is obtained, is then minimum.

In a preferred method variant, the path z(u) and/or the angular behavior φ(u) are determined using numerical methods. Numerical methods are easier to realize than analytical methods. The calculation accuracy can be adjusted to the individual requirements.

Another preferred inventive method variant provides that the initial conditions are z(0)=0 and z'(0)=0. For z'(0)=0 one assumes that the increase of the coil winding at the beginning of the transition region can be neglected. This realistic approximation facilitates calculation of z(u).

One method variant is particularly preferred with which the minimum bending radius $r_{min}$ of the band-shaped superconductor about its broad side is multiplied by a safety factor S1, in particular S1≦1.2, and/or the maximum permitted torsion $\tau_{max}$ is multiplied by a safety factor S2, in particular S2≧0.8. Small errors in the conversion of the calculated behavior of the band conductor do not thereby produce fatal excursions below or beyond the material limit values $r_{min}$ and $\tau_{max}$ to thereby avoid material failure. Deviations of the conductor guiding parameters z, u, (φ of up to approximately 20% of the calculated value can be accepted for values of S1=1.20 and S2=0.80.

The invention also concerns a high-field magnet coil with at least one coil section, wherein the coil section is wound with a band-shaped superconductor like a solenoid on a cylindrical coil body, characterized in that the band-shaped superconductor has at least one transition region in which it is transferred from a first orientation tangentially flatly abutting the surface of the cylindrical coil body and substantially perpendicular to the longitudinal direction of the cylindrical coil body along a path to a second orientation with its narrow side seating on the surface of the cylindrical coil body, parallel to the longitudinal direction (or vice versa). This construction eliminates the joint in the edge region of the coil section for contacting the coil section in an axial direction (along the axis of the cylindrical coil body).

One embodiment of the inventive high-field magnet coil is particularly preferred, with which the behavior of the band-shaped superconductor corresponds approximately to the path z(u) or to the angular behavior φ(u) calculated according to one of the above-mentioned inventive methods. In this case, the space required for the transfer of the band-shaped superconductor from the initial azimuthal orientation to the axial orientation is particularly small.

One embodiment is also particularly preferred with which the path of the band-shaped superconductor is fixed, preferably by a groove in the cylindrical coil body, in particular in the transition region. The band-shaped superconductor abuts flatly in the groove. This reduces the material load in response to possible forces (e.g. magnetic forces when the coil section is charged). Moreover, the band-shaped superconductor can be placed and fixed in accordance with the invention with ease and precise orientation. The arrangement can subsequently be cast.

One embodiment is also particularly preferred with which the bottom of the guiding groove does not follow the torsion of the band but extends on the surface of a cylinder. Such a groove is much easier to produce than a groove with tilted bottom. The groove also follows the curved behavior calculated according to the inventive method. The band-shaped superconductor is then uniformly disposed in this groove. The inner tensions which occur in the conducting band automatically produce a travel with constant torsion such that the band again approximately follows the path calculated in accordance with the invention. Subsequent casting of the groove ensures arresting of the band in this position.

A particularly advantageous embodiment of the inventive high-field magnet coil provides that the band-shaped superconductor comprises a high-temperature superconductor (HTSC). In this case, sharp bends of the band-shaped superconductor are not possible and the inventive teaching is the only way to avoid joints in a region of considerable magnetic field when tangential guiding away of the conductor perpendicular to the cylinder axis is not geometrically possible.

One embodiment of the inventive high-field magnet coil comprises at least one further radially outer coil section. This is the most frequent and most important case of a geometrical obstacle mentioned above.

In a further development of this embodiment, the radially outer coil section(s) project(s) beyond the radially inner coil section(s) in an axial direction. The advantages of the invention are thereby optimally utilized. The projecting outer coil section prevents tangential guiding away of the band-shaped superconductor perpendicular to the cylinder axis.

In a preferred embodiment of the inventive high-field magnet coil, the minimum admissible bending radius $r_{min}$ of the band-shaped superconductor is on the order of magnitude of the radius $r_0$ of the cylindrical coil body of the radially innermost coil section. This permits optimum adjustment of the coil geometry to brittle superconducting material and brittle HTSC materials and the inventive coil geometry can be optimally utilized to produce maximum magnetic field strengths.

In a further preferred embodiment, the high-field magnet coil is designed to produce a magnetic induction strength >20T. NMR measurements which utilize a magnetic field of the high-field magnet coil consequently permit good resolution.

In one embodiment, the operating temperature is approximately less than or equal to 4 K, in particular approximately 2 K. This low operating temperature permits use of higher magnetic field strengths to fully utilize the advantage of the inventive geometry which i.a. guides the joints to a region of lower magnetic field strength.

One embodiment of the inventive high-field magnet coil is also advantageous with which all coil sections are connected in series. This circuit is particularly simple.

In one embodiment, all coil sections are operated in persistent current mode, i.e. all in series, individually, or combined in groups. This "persistent mode" operation permits particularly good temporal stability of the magnetic field and eliminates noise and instabilities of the power supply unit. This however requires that the conductors and joints largely operate without loss, a feature to which the inventive design contributes.

One further advantageous embodiment of the inventive high-field magnet coil is characterized in that all coil sections which do not contain HTSC are connected in series and are optionally operated in persistent current mode. This electrically connects part of the coil arrangement in a reasonable and simple fashion.

In a further development of this embodiment, a device is provided for operating the coil section containing the HTSC with a separate power supply unit. This power supply unit can then be adjusted to the requirements of that section only. Also in this case, a separate persistent current mode is optionally provided.

The invention also concerns an NMR (nuclear magnetic resonance) high-field magnet coil system comprising superconducting conductor structures for generating an extremely homogeneous and highly temporally stable magnetic field $B_0$ in a measuring volume, characterized in that the magnet coil system comprises an inventive high-field magnet coil. Particularly important to NMR is the avoidance of drifts for high magnetic field strengths obtained with compact coil arrangement, wherein elimination of joints in the region of considerable magnetic field strengths is particularly advantageous.

The invention also concerns a device for producing an inventive high-field magnet coil in accordance with an inventive calculating method described above, characterized in that the device comprises a computer for calculating the behavior of the band-shaped superconductor.

In an advantageous further development of this device, a milling or erosion means is provided for computer-controlled production of the groove in the cylindrical coil body to permit particularly precise production of the groove in correspondence with the calculation.

Further advantages of the invention can be extracted from the description and the drawing. The features mentioned above and below can be used in accordance with the invention either individually or collectively in arbitrary combination. The embodiments shown and described are not to be understood as exhaustive enumeration but rather have exemplary character for describing the invention.

The invention is shown in the drawing and explained in more detail with reference to embodiments.

DESCRIPTION OF THE PREFERRED EMBODIMENT

The inventive method for calculating a path of a conductor guidance is illustrated with a flat high-temperature superconducting band of rectangular cross-section having the following bending parameters:

Minimum bending radius about the broad side: $r_{min}$

Very large (i.e. infinite) minimum bending radius across the narrow side

Maximum admissible torsion: $\tau_{max}$

The band is wound onto a coil body to a radius $r_0 > r_{min}$ and is to be transferred onto the cylinder envelope (radius $r_0$) from the azimuthal to the axial direction without exceeding the bending parameters. If z is the axial coordinate and u the azimuthal coordinate, the band describes a curve z(u) on the cylinder envelope surface. To turn the band out of the azimuthal direction, it must at first be raised since bending about the narrow side is not possible or only possible to a very limited degree. The further the band is raised, the more it can be bent in the u-z plane. If it is perpendicular on the u-z plane, the minimum bending radius $r_{min}$ is admissible. If φ is the angle between the broad side of the band and the u-z-plane, the minimum admissible bending radius is given by the projection of the band, bent about the broad side with a minimum radius, onto the u-z-plane:

$$r = \frac{r_{min}}{\sin\varphi}$$

Assuming that the torsion of the band is constant with length, i.e.

$$\varphi(l) = \tau l$$

wherein l is the instantaneous length position along the band and $\tau \leq \tau_{max}$, the travel of the conductor produces a limiting curve with a maximum curvature of $$\kappa(l) = \frac{1}{r} = \frac{\sin(\tau l)}{r_{min}}$$

and using the relationships $$l = \int_0^u d\hat{u}\sqrt{1+z'(\hat{u})^2}$$

(Bronstein p.315 and S.590)

$$\kappa = \frac{z''(u)}{(1+z'(u)^2)^{\frac{3}{2}}}$$

one obtains the following integral-differential equation for the path of the band:

$$\frac{z''(u)}{(1+z'(u)^2)^{\frac{3}{2}}} = \frac{\sin\left(\tau \int_0^u d\hat{u}\sqrt{1+z'(\hat{u})^2}\right)}{r_{min}}$$

The state of the band at the end of the coil winding produces the following initial conditions (unless other relationships are set):

$z(0)=0$, $z'(0)=0$

The differential equation can be solved with conventional numerical methods.

Figure 1:
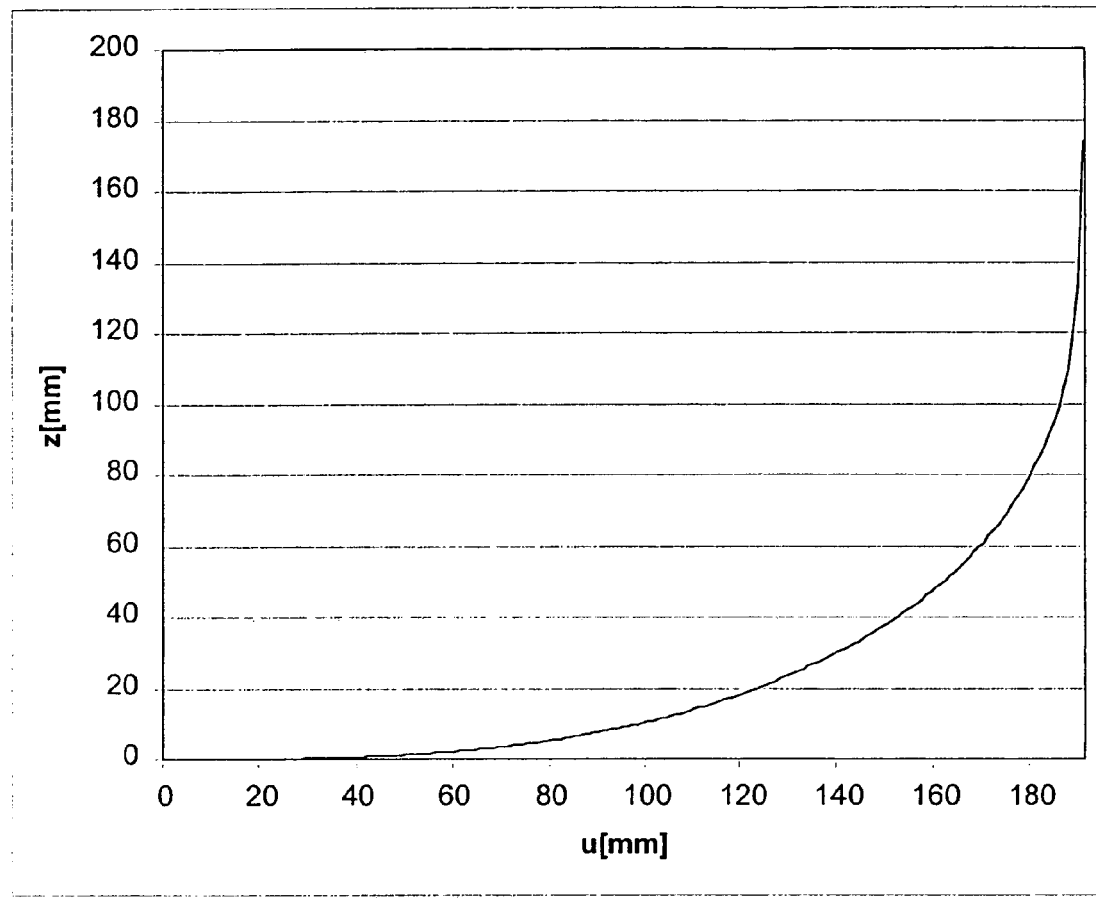
FIG. 1 shows a z-u diagram of a band path for t=360°/1000 mm, $r_{min}$=100 mm.

Example: The path shown in FIG. 1 was numerically calculated for a band having a minimum bending radius of $r_{min}=100$ mm, with a constant torsion of $\tau=360°/1000$ mm. With a u-value for the azimuthal coordinate of approximately 190 mm, the z-value of the axial coordinate (longitudinal coordinate) extends asymptotically to infinity. This means that the z-value can be changed without changing the u-value. Guiding out the conductor in the axial z direction is possible without having to wind it further around the cylindrical envelope for such axial orientation of the conductor at this location.

If the band is disposed on a cylinder envelope having a radius $r_0$ of 120 mm, approximately a quarter turn is required for transfer from the azimuthal to the axial direction.

Figure 2:
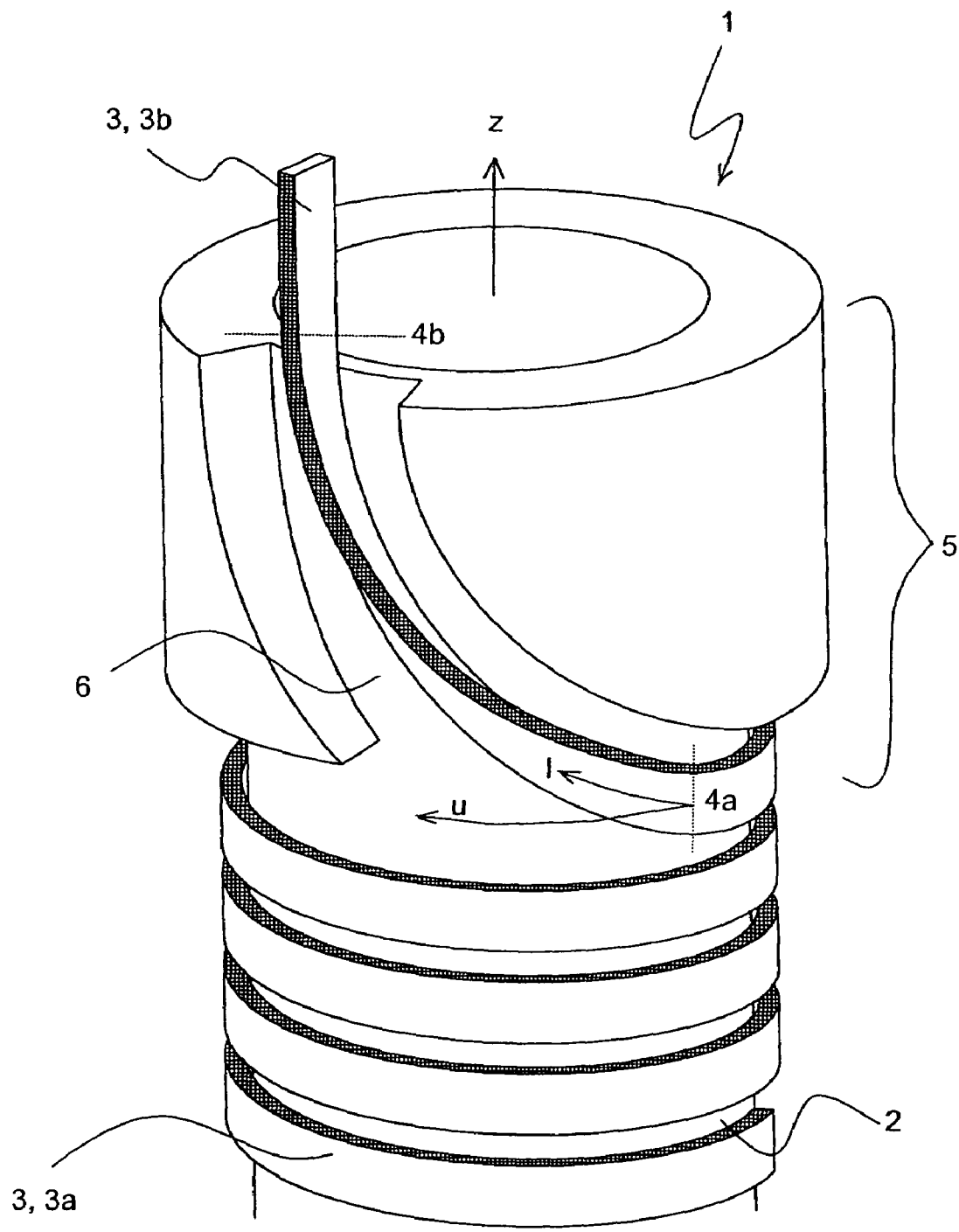
FIG. 2 shows an embodiment of an inventive high-field magnet coil.

FIG. 2 schematically shows an edge section of an inventive high-field magnet coil 1 with a solenoidal coil section. A band-shaped superconductor 3 is wound onto a cylindrical coil body 2. The windings of the band-shaped superconductor 3 form an electromagnet. The band-shaped superconductor 3 is azimuthally oriented in a first orientation, i.e. abutting flatly on the cylindrical coil body 1 and (assuming small pitch) approximately perpendicular to an axis z of the cylindrical coil body 2. The major part of the coil section of the high-field magnet coil 1 is wound in this fashion. The band-shaped superconductor 3 starts to rise at a first boundary point 4a. The angle φ between the broad side of the band-shaped superconductor 3 and the surface of the cylindrical coil body 2 located directly below gradually increases from the first boundary point 4a from 0° to finally 90° at a second boundary point 4b. At the same time, the direction of extension of the band-shaped superconductor 3 changes from a direction approximately perpendicularly to the z-direction to an orientation parallel to the z-direction. Starting from the second boundary point 4b, the band-shaped superconductor 3 assumes an axial second orientation 3b parallel to the z-axis and seating perpendicular on the surface of the cylindrical coil body 2. The section of the high-field magnet coil 1 between the two boundary points 4a, 4b is designated as transfer region 5. In the second orientation 3b, the band-shaped superconductor 3 can be easily guided out of the high-field region of the high-field magnet coil 1, in particular, to sufficient separation from the center of the high-field magnet coil 1 in the z-direction. Joints can therefore be disposed in the quasi field-free space and do not limit the efficiency of the high-field magnet coil 1.

The band-shaped superconductor 3 is guided through the groove 6 in the transfer region 5. In FIG. 2, the groove 6 is much wider than the band-shaped superconductor 3 for reasons of clarity. In reality, the side surfaces of the groove 6 will nearly contact the outer edges of the superconductor 3. The groove 6 is furthermore shown with a bottom extending in a cylinder envelope surface. The band-shaped superconductor 3 is uniformly disposed in this groove 6 and is subsequently cast. The groove 6 may optionally have a downwardly tilting bottom such that the angle between the bottom and local surface of the cylindrical coil body 2 is determined according to $$\varphi(u) = \tau \int_0^u d\hat{u}\sqrt{1+z'(\hat{u})^2}$$

The band-shaped superconductor 3 abuts flatly on the bottom of the groove 6.

The path of the band-shaped superconductor 3 is thereby such that the critical material parameters of the band-shaped superconductor 3, in particular the minimum bending radius $r_{min}$ about the broad side and the maximum admissible torsion $\tau_{max}$, are observed. This is preferably effected in that the path of the band-shaped superconductor 3 is calculated in accordance with the invention. A path of the band-shaped superconductor can then be determined according to the calculated relationships among axial coordinate z, azimuthal coordinate u, and angle φ. The azimuthal coordinate u thereby corresponds to a longitudinal coordinate l projected onto a plane perpendicular to the z-direction. The coordinate origin is one of the boundary points 4a or 4b. In FIG. 2, the boundary point 4a was selected to be the coordinate origin.

A method for calculating the shape of a band-shaped superconductor 3 of a solenoidal coil section of a high-field magnet coil 1 in a transfer region 5 is characterized in that the band-shaped superconductor is mapped in the transfer region from a first orientation 3a tangentially flatly abutting the surface of a cylindrical coil body 2 and approximately perpendicularly to the longitudinal direction of the cylindrical coil body to a second orientation 3b with its narrow side seating on the surface of the cylindrical coil body and parallel to the longitudinal direction (or vice versa), wherein a path z(u) is determined from the integral-differential equation $$\frac{z''(u)}{(1+z'(u)^2)^{\frac{3}{2}}} = \frac{\sin\left(\tau \int_0^u d\hat{u}\sqrt{1+z'(\hat{u})^2}\right)}{r_{min}}$$

wherein z: axial coordinate; u: azimuthal coordinate; û: auxiliary coordinate; τ: constant torsion in the transfer region; $r_{min}$ minimum bending radius of the band-shaped superconductor, and wherein the position z=0, u=0 is associated with a boundary point 4a of the transfer region. This permits conductor guidance of a brittle band-shaped superconductor of a solenoidal coil section in an axial direction in a compact manner and without joints.

We claim:

1. A method for calculating a shape of at least one band-shaped superconductor in at least one coil section of a high-field magnet coil, the shape extending through a transfer region towards or away from that coil section, the coil section being wound in a solenoid fashion on a cylindrical coil body, the method comprising the step of:

mapping the band-shaped superconductor in the transfer region between a first orientation, tangentially flatly abutting a surface of the cylindrical coil body and substantially perpendicular to a longitudinal direction of that cylindrical coil body, and second orientation in which a narrow side of the band-shaped superconductor seats on the surface of the cylindrical coil body and extends substantially parallel to the longitudinal direction, wherein a path $z(u)$ of the band shaped superconductor through the transfer region is determined from the following integral-differential equation $$\frac{z''(u)}{(1+z'(u)^2)^{\frac{3}{2}}} = \frac{\sin\left(\tau \int_0^u d\hat{u}\sqrt{1+z'(\hat{u})^2}\right)}{r_{min}}$$

wherein z is a coordinate of the band-shaped superconductor in the longitudinal direction of the coil body, u an azimuthal coordinate of the band-shaped superconductor, $\hat{u}$ an auxiliary coordinate, $\tau$ a constant torsion in the transfer region, and $r_{min}$ a minimum bending radius of the band-shaped superconductor about its wide side, wherein $z=0$, $u=0$ defines a boundary point of the transfer region.

2. The method of claim 1, further comprising defining an angle $\phi$ between a flat side of the band-shaped superconductor and a local surface of the cylindrical coil body according to the relationship $$\varphi(u) = \tau \int_0^u d\hat{u}\sqrt{1+z'(\hat{u})^2}$$

3. The method of claim 1, wherein $\tau$ is a maximum admissible torsion $\tau_{max}$ of the band-shaped superconductor.

4. The method of claim 1, wherein the path $z(u)$ and/or an angular behavior of $\phi(u)$ are determined using numerical methods.

5. The method of claim 1, wherein $z(0)=0$ and $z'(0)=0$ are selected as initial conditions.

6. The method of claim 1, further comprising multiplying the minimum bending radius $r_{min}$ of the band-shaped superconductor with respect to its broad side by a safety factor S1 and multiplying a maximum admissible torsion $\tau_{max}$ by a safety factor S2.

7. The method of claim 6, wherein $S1 \leq 1.20$ and $S2 \geq 0.8$.

8. A high-field magnet roil having the transfer region of the at least one band-shaped superconductor as calculated using the method of claim 1.

9. The high-field magnet coil of claim 8, wherein of the band-shaped superconductor is fixed by a groove in the cylindrical coil body disposed in the transfer region.

10. The high-field magnet coil of claim 9, wherein a bottom said groove does not follow a torsion of the band shaped superconductor and extends on a surface of a cylinder.

11. The high-field magnet coil of claim 8, wherein the band-shaped superconductor comprises a high-temperature superconductor (HTSC).

12. The high-field magnet coil of claim 8, further comprising at least one additional coil section which is disposed radially further outwards of said coil section.

13. The high-field magnet coil of claim 12, wherein said additional coil section projects beyond said coil section in an axial direction.

14. The high-field magnet coil of claim 8, wherein a minimum admissible bending radius $r_{min}$ of the band-shaped superconductor has an order of magnitude equal to an order of magnitude of a radius $r_0$ of the cylindrical coil body of a radially innermost coil section.

15. The high-field magnet coil of claim 8, wherein the high-field magnet coil is structured to generate a magnetic induction strength >20T.

16. The high-field magnet coil of claim 8, wherein an operating temperature is less than or equal to approximately 4K.

17. The high-field magnet coil of claim 8, wherein all coil sections are connected in series.

18. The high-field magnet coil of claim 8, wherein all coil sections are operated in persistent current mode.

19. The high-field magnet coil of claim 8, wherein all coil sections which do not contain HTSC are connected in series.

20. The high-field magnet coil of claim 19, further comprising means for operating a coil section containing HTSC using a separate power supply unit.

21. An NMR (nuclear magnetic resonance) high-field magnet coil system comprising superconducting conductor structure for generating a homogeneous magnetic field $B_0$ in a measuring volume, the magnet coil system comprising the high-field magnet coil of claim 8.

22. A device for producing a high-field magnet coil using the method of claim 1, the device comprising a computer for calculating the shape of the band-shaped superconductor in the transfer region.

23. The device of claim 22, further comprising milling or erosion means for computer controlled generation of a groove in the cylindrical coil body.

* * * * *